US006894916B2

(12) United States Patent
Reohr et al.

(10) Patent No.: US 6,894,916 B2
(45) Date of Patent: May 17, 2005

(54) MEMORY ARRAY EMPLOYING SINGLE THREE-TERMINAL NON-VOLATILE STORAGE ELEMENTS

(75) Inventors: William Robert Reohr, Ridgefield, CT (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 10/256,715

(22) Filed: Sep. 27, 2002

(65) Prior Publication Data

US 2004/0062075 A1 Apr. 1, 2004

(51) Int. Cl.[7] ............................ G11C 11/22; G11C 5/06
(52) U.S. Cl. ...................... 365/148; 365/145; 365/65
(58) Field of Search ........................... 365/148, 145, 365/65, 67, 100

(56) References Cited

U.S. PATENT DOCUMENTS

| | | | | |
|---|---|---|---|---|
| 3,786,448 A | * | 1/1974 | Batcher et al. ............. | 365/139 |
| 3,832,700 A | | 8/1974 | Wu et al. | |
| 4,873,664 A | | 10/1989 | Eaton, Jr. | |
| 4,888,733 A | | 12/1989 | Mobley | |
| 5,418,389 A | | 5/1995 | Watanabe | |
| 5,487,029 A | * | 1/1996 | Kuroda ...................... | 365/149 |
| 5,757,042 A | | 5/1998 | Evans, Jr. et al. | |
| 5,789,775 A | | 8/1998 | Evans, Jr. et al. | |
| 5,804,850 A | | 9/1998 | Evans, Jr. et al. | |
| 6,067,244 A | | 5/2000 | Ma et al. | |
| 6,122,190 A | * | 9/2000 | Ooishi ........................ | 365/149 |
| 6,229,728 B1 | | 5/2001 | Ono et al. | |
| 6,259,114 B1 | | 7/2001 | Misewich et al. | |
| 6,333,543 B1 | | 12/2001 | Schrott et al. | |
| 6,350,622 B2 | | 2/2002 | Misewich et al. | |
| 6,373,743 B1 | * | 4/2002 | Chen et al. .................. | 365/145 |
| 2003/0012064 A1 | * | 1/2003 | Beretta ........................ | 365/200 |

OTHER PUBLICATIONS

Georg Braun et al., "A Robust 8F2 Ferroelectric RAM Cell With Depletion Device (DeFeRAM)," IEEE Journal of Solid–State Circuits, vol.: 35, Issue: 5, pp. 691–696, May 2000.

* cited by examiner

*Primary Examiner*—Richard Elms
*Assistant Examiner*—J. H. Hur
(74) *Attorney, Agent, or Firm*—Thu Ann Dang; Ryan, Mason & Lewis, LLP

(57) ABSTRACT

An improved non-volatile memory array comprises a plurality of memory cells, at least one of the memory cells comprising a three-terminal non-volatile storage element for storing a logical state of the at least one memory cell. The memory array further comprises a plurality of write lines operatively coupled to the memory cells for selectively writing the logical state of one or more memory cells in the memory array, and a plurality of bit lines and word lines operatively coupled to the memory cells for selectively reading and writing the logical state of one or more memory cells in the memory array. The memory array is advantageously configured so as to eliminate the need for a pass gate being operatively coupled to a corresponding non-volatile storage element in the at least one memory cell.

18 Claims, 7 Drawing Sheets

MEMORY ARRAY EMPLOYING SINGLE THREE-TERMINAL NON-VOLATILE STORAGE ELEMENTS

CROSS-REFERENCE TO RELATED APPLICATIONS

The present application is related to the U.S. patent application identified by Ser. No. 10/256,881 and entitled "Non-Volatile Memory Using Ferroelectric Gate Field-Effect Transistors," which is filed concurrently herewith and incorporated herein by reference.

FIELD OF THE INVENTION

The present invention relates generally to memory circuits, and more particularly relates to a memory array comprising a plurality of three-terminal non-volatile storage elements.

BACKGROUND OF THE INVENTION

Using ferroelectric material in the manufacture of non-volatile memories has been well-established. For instance, U.S. Pat. No. 3,832,700 issued to Wu et al. describes a ferroelectric memory device which utilizes remnant polarization of a ferroelectric film as the storage mechanism. This structure may be considered analogous to a conventional electrically erasable programmable read-only memory (EEPROM). U.S. Pat. No. 4,873,664 issued to Eaton, Jr. describes a semiconductor memory device utilizing memory cells having a ferroelectric capacitor coupled to a bit line via a transistor, much like a conventional dynamic random access memory (DRAM).

Both DRAM-like memory cell structures and EEPROM-like cell structures have been proposed for use in ferroelectric memory products. Modern ferroelectric memory products exploit the DRAM-type cell structure almost exclusively. Such structures have both the advantage of minimizing integration complexity, by separating the storage capacitor from the silicon devices region, and improving cell density, by stacking the ferroelectric capacitor on top of the silicon devices.

Although this type of memory may be easy to fabricate, the DRAM-like cell structure has several disadvantages, including coupled noise sensitivity, coupled noise generation, large power consumption and low overall performance. The density of the memory device suffers compared to conventional DRAM due, at least in part, to the use of a ferroelectric capacitor plate electrode and the need for a special driver circuit. Moreover, because the driver circuit must be capable of driving a heavily loaded wire during read and write operations, it is particularly slow. Additionally, a boosted high voltage signal is required for both read and write operations. This results in significant noise coupling between signal lines as well as high power consumption. Although there has been some recent progress in terms of density, power consumption and material-related problems, several fundamental issues remain in ferroelectric memories exploiting a DRAM-type cell structure which prevent this type of conventional memory from being used in high density, high speed and/or low power applications.

There exists a need, therefore, for an improved non-volatile memory array that does not exhibit the above-noted disadvantages present in conventional non-volatile memory arrays.

SUMMARY OF THE INVENTION

The present invention provides an improved non-volatile memory array which eliminates at least some of the disadvantages present in conventional non-volatile memory arrays. The memory array of the invention utilizes ferroelectric memory cells which include a single ferroelectric device, thereby providing a smaller memory cell which, when incorporated into the memory array, advantageously results in a denser memory array compared to conventional memory architectures.

In accordance with one aspect of the invention, an improved non-volatile memory array comprises a plurality of memory cells, at least one of the memory cells comprising a three-terminal non-volatile storage element for storing a logical state of the at least one memory cell. The memory array further comprises a plurality of write lines operatively coupled to the memory cells for selectively writing the logical state of one or more memory cells in the memory array, and a plurality of bit lines and word lines operatively coupled to the memory cells for selectively reading and writing the logical state of one or more memory cells in the memory array. The memory array is advantageously configured so as to eliminate the need for a pass gate operatively coupled to a corresponding non-volatile storage element in the at least one memory cell.

In accordance with another aspect of the invention, a method of forming a non-volatile memory array comprises the steps of: providing a plurality of memory cells, at least one memory cell comprising a three-terminal non-volatile storage element for storing a logical state of the at least one memory cell; and coupling the memory cells to a plurality of write lines, bit lines and word lines for selectively reading and writing the logical state of one or more memory cells in the memory array, the memory cells being operatively coupled to the write lines, bit lines and word lines so as to eliminate a need for a pass gate being coupled to a corresponding non-volatile storage element in the at least one memory cell.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described herein in the context of a memory architecture employing a plurality of memory cells, each of the memory cells comprising a single ferroelectric gate field-effect transistor (FeGFET) device. The FeGFET device in each memory cell serves as a non-volatile storage element, retaining the logical state of a given cell without an expenditure of energy. It should be appreciated, however, that the present invention is not limited to this or any particular memory architecture. Rather, the invention is more generally applicable to providing a non-volatile memory architecture that is configured so as to advantageously eliminate the need for a pass gate being coupled to the storage element in at least a portion of the memory cells. Moreover, the present invention is not limited to FeGFET devices used as a memory cell. Instead, any three-terminal storage element exhibiting a variable resistance change caused by an applied electric field may be employed with the present invention, wherein the change in resistance is preserved after removal of the field.

Figure 1:
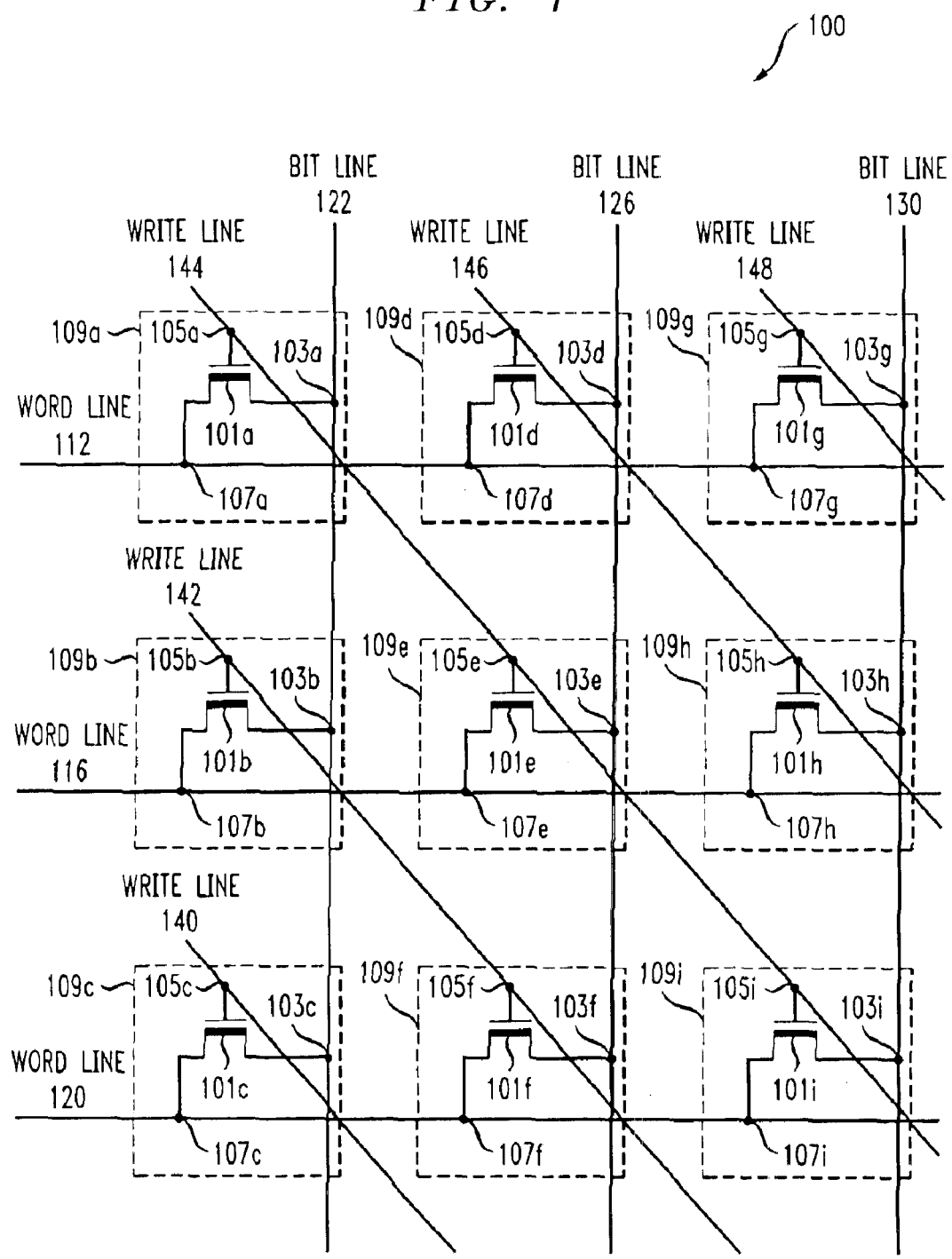
FIG. 1 is an electrical schematic diagram depicting at least a portion of an illustrative non-volatile memory array, formed in accordance with one aspect of the present invention.

FIG. 1 illustrates at least a portion of an exemplary non-volatile memory architecture 100, formed in accordance with one aspect of the invention. The memory architecture 100 preferably includes a plurality of memory cells 109a, 109b, 109c, 109d, 109e, 109f, 109g, 109h and 109i (referred to herein collectively as 109). The memory array 100 further includes a plurality of word lines 112, 116 and 120, a plurality of bit lines 122, 126 and 130, and a plurality of write lines 140, 142, 144, 146 and 148, operatively coupled to the memory cells 109 for selectively reading and writing one or more memory cells in the array. The bit lines 122, 126, 130 are preferably arranged parallel to one another and orthogonal to the word lines 112, 116, 120. For example, bit lines 122, 126, 130 may be arranged in a column (i.e., vertical) dimension and word lines 112, 116, 120 may be arranged in a row (i.e., horizontal) dimension, as depicted in the figure. The write lines 140, 142, 144, 146, 148 are preferably arranged diagonally with respect to the bit lines and word lines, such that no two memory cells coupled to the same word line or bit line are coupled to the same write line. A complete memory circuit may be formed by connecting the write lines 140, 142, 144, 146, 148, word lines 112, 116, 120 and bit lines 122, 126, 130 of memory array 100 to peripheral circuitry (not shown), including, for example, word drivers, bit drivers/multiplexors, write circuits (e.g., decoders), read circuits (e.g., sense amplifiers), etc.

Each of the memory cells 109a, 109b, 109c, 109d, 109e, 109f, 109g, 109h, 109i, preferably includes a corresponding FeGFET device 101a, 101b, 101c, 101d, 101e, 101f, 101g, 101h, 101i, respectively, (referred to herein collectively as 101) for storing the logical state of the memory cell. Each of the FeGFETs 101 includes a gate terminal, a source terminal and a drain terminal. Due to the bi-directional nature of the FeGFET device, the designation of drain and source terminals is essentially arbitrary. Consequently, the drain and source terminals of the FeGFET will be referred to herein as first and second drain/source terminals. A FeGFET device suitable for use with the present invention is described, for example, in related application entitled "Non-Volatile Memory Using Ferroelectric Gate Field Effect Transistors," Ser. No. 10/256,881, filed concurrently herewith, which is incorporated herein by reference. It is to be appreciated that alternative ferroelectric memory devices may be similarly employed in accordance with the present invention.

The memory cells 109 are preferably coupled at the intersections of corresponding bit lines and word lines, as in a crosspoint array configuration, although alternative connection arrangements are contemplated. Specifically, FeGFET 101a is configured having its gate terminal connected to write line 144 at node 105a, its first drain/source terminal connected to word line 112 at node 107a and its second drain/source terminal connected to bit line 122 at node 103a. Likewise, the gate terminal of FeGFET 101b is connected to write line 142 at node 105b, the first drain/source terminal is connected to word line 116 at node 107b, and the second drain/source terminal is connected to bit line 122 at node 103b. The gate terminal of FeGFET 101c is connected to write line 140 at node 105c, the first drain/source terminal is connected to word line 120 at node 107c, and the second drain/source terminal is connected to bit line 122 at node 103c. The gate terminal of FeGFET 101d is connected to write line 146 at node 105d, the first drain/source terminal is connected to word line 112 at node 107d, and the second drain/source terminal is connected to bit line 126 at node 103d. The gate terminal of FeGFET 101e is connected to write line 144 at node 105e, the first drain/source terminal is connected to word line 116 at node 107e, and the second drain/source terminal is connected to bit line 126 at node 103e. The gate terminal of FeGFET 101f is connected to write line 142 at node 105f, the first drain/source terminal is connected to word line 120 at node 107f, and the second drain/source terminal is connected to bit line 126 at node 103f. The gate terminal of FeGFET 101g is connected to write line 148 at node 105g, the first drain/source terminal is connected to word line 112 at node 107g, and the second drain/source terminal is connected to bit line 130 at node 103g. The gate terminal of FeGFET 101h is connected to write line 148 at node 105g, the first drain/source terminal is connected to word line 112 at node 107g, and the second drain/source terminal is connected to bit line 130 at node 103g. The gate terminal of FeGFET 101h is connected to write line 146 at node 105h, the first drain/source terminal is connected to word line 116 at node 107h, and the second drain/source terminal is connected to bit line 130 at node 103h. The gate terminal of FeGFET 101i is connected to write line 144 at node 105i, the first drain/source terminal is connected to word line 120 at node 107i, and the second drain/source terminal is connected to bit line 130 at node 103i.

An important benefit of memory array 100 is that the configuration described above eliminates the need for a pass gate or field-effect transistor (FET) device coupled to the FeGFET in the memory cells. This advantageously allows a smaller memory cell to be formed, thereby providing a more dense memory architecture.

Each of the memory cells 109 in memory array 100 are preferably utilized in at least a standby mode, a read mode, or a write mode, as will be explained in further detail below. Preferably, the memory cells remain in the standby mode until a read or write operation is requested, and subsequently return to the standby mode once the read or write operation has ended. In a standby mode of operation, the state of the memory cell, which is stored within the FeGFET device, is protected (i.e., maintained). A robust bistable state for the FeGFET device is preferably obtained by reducing an electric field across a ferroelectric gate dielectric layer in the FeGFET device to substantially zero. This may be accomplished, for example, by electrically connecting the gate, drain and source terminals of the FeGFET device to a common equipotential voltage $V_{eq}$, thereby maintaining uniformity of an electric dipole orientation of the ferroelectric gate dielectric layer in the FeGFET. The absence of electric fields prevents field-induced reversal of any domains (i.e., electric dipoles) within the FeGFET devices, thus preserving the logical states of all memory cells in the array.

While in the standby mode, all write lines 140, 142, 144, 146, 148, word lines 112, 116, 120, and bit lines 122, 126, 130 in the memory array 100 are preferably held at the equipotential voltage $V_{eq}$, thus essentially coupling all terminals of each of the FeGFETs 101 to the common voltage potential $V_{eq}$. The equipotential voltage $V_{eq}$ may be essentially any voltage between the negative (e.g., ground) and positive (e.g., $V_{DD}$) voltage supply rails of the memory array, and is preferably about half the supply voltage (e.g., $V_{DD}/2$). By forcing all write, word and bit lines to be at the same voltage, no driving potential will exist in the memory array 100, and therefore the respective logical states of the electric dipoles associated with FeGFETs 101 are maintained. Since the dipole orientation of each FeGFET defines the logical (i.e., Boolean) state of the corresponding memory cell, the memory state of a given memory cell in the standby mode is unchanged. Moreover, since no current flows while the word and bit lines are at the equipotential voltage, virtually no power is consumed in the memory array 100.

By way of example only, a read operation directed to a selected memory cell 109e in the illustrative memory array 100 will now be described. In the following discussion, it will be assumed that all memory cells, including selected memory cell 109e, are initially in a standby mode of operation, as previously explained. Each memory cell is set in either of two stable states (e.g., state 1 or state 2). The state of the selected memory cell 109e may be determined by evaluating a drain/source conductivity of the FeGFET device 101e corresponding thereto. As long as this determination is made with a potential less than a coercive field of the ferroelectric gate dielectric layer, the read operation will be nondestructive (i.e., the state of the channel will be maintained). Therefore, to accomplish the read operation without disturbing the existing states of the memory cells, write lines 140, 142, 144, 146, 148, bit lines 122, 126, 130, and word lines 112, 120 are preferably held at the equipotential voltage $V_{eq}$, an exception being word line 116 which partially selects the selected memory cell 109e for a read operation. Word line 116 is preferably set to a voltage that is slightly above or below the equipotential voltage $V_{eq}$ during the read operation, as will be described in further detail below.

Figure 2:
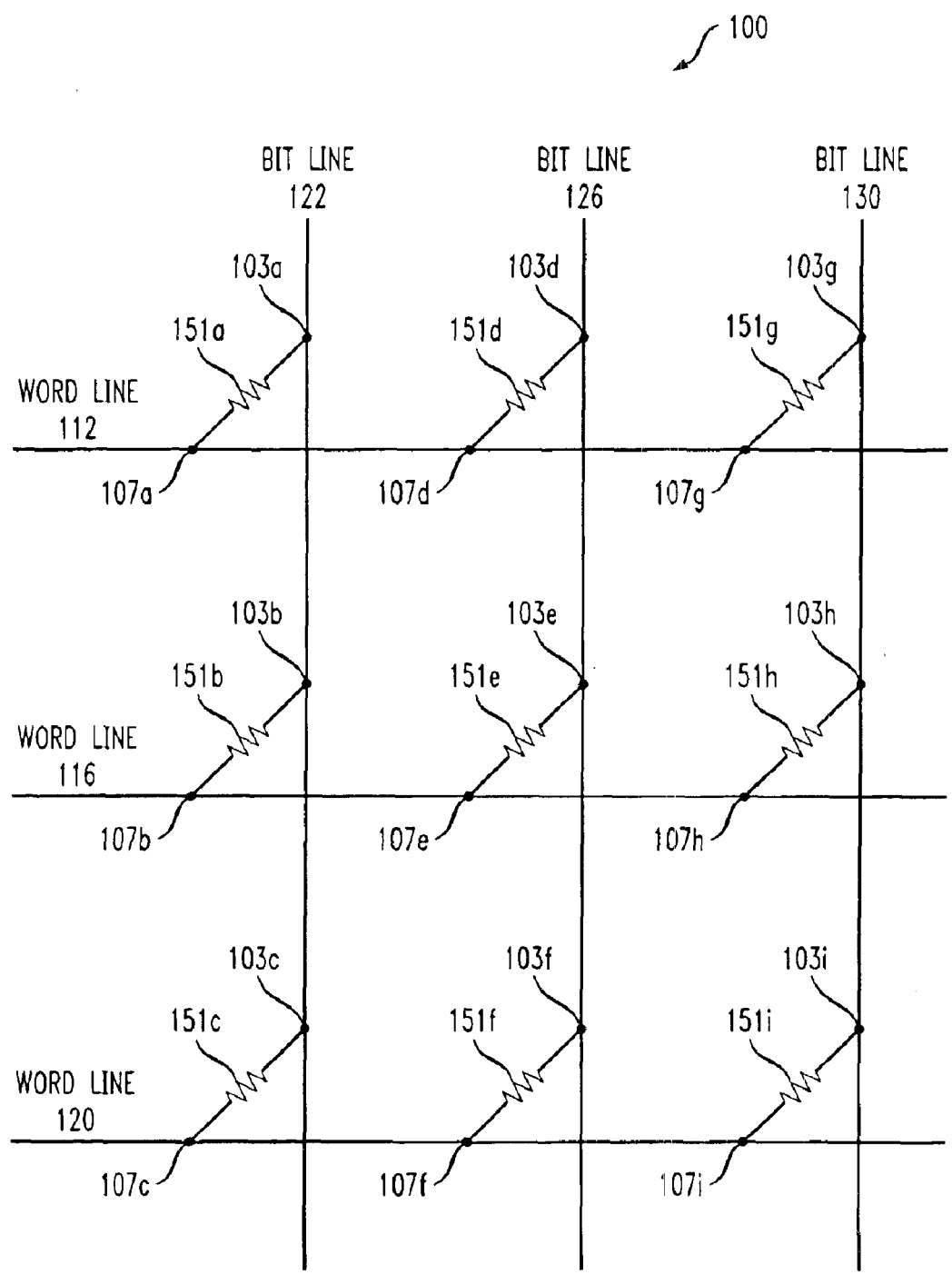
FIG. 2 is an electrical schematic diagram illustrating a simplified circuit of the memory array shown in FIG. 1.

The channel region of a given FeGFET 101e appears across the first and second drain/source terminals of the FeGFET, which can be measured on a corresponding word line 116 and bit line 126 coupled thereto. FIG. 2 depicts a simplified schematic diagram of the memory array 100. As shown in the figure, the channel regions of the FeGFET devices 101a, 101b, 101c, 101d, 101e, 101f, 101g, 101h, 101i may be modeled as resistors 151a, 151b, 151c, 151d, 151e, 151f, 151g, 151h, 151i, respectively, (referred to herein collectively as 151) coupled between corresponding bit lines and word lines in the array. For example, the channel region in FeGFET 101e is represented as resistor 151e coupled across bit line 126 at node 103e and word line 116 at node 107e. The resistance value of each of the resistors 151 changes in accordance with the logical state of the FeGFET device associated therewith, which represents one of two possible dipole orientations of the FeGFET. Write lines 140, 142, 144, 146, 148 are preferably held at the equipotential voltage $V_{eq}$, as previously stated, and are therefore not shown in FIG. 2.

The state of a given memory cell can be ascertained by a sensing technique which preferably forces a voltage and concurrently measures a signal current (or vice versa), as is known in the art. In this manner, the resistance of the channel region in the FeGFET can be obtained, which is representative of the logical state of the memory cell corresponding thereto. As previously stated, the selected memory cell preferably begins in the standby mode and subsequently transitions into the read mode.

With continued reference to FIGS. 1 and 2, in order to read a selected memory cell 109e in the memory array 100, at least two actions are preferably performed. First, the word line 116 corresponding to the selected memory cell 109e is preferably driven to a voltage potential above or below the equipotential voltage $V_{eq}$. Second, while in the read mode, a sense amplifier (not shown) is connected to the bit line 126 associated with the selected memory cell 109e. The sense amplifier preferably clamps the voltage on the selected bit line 126 to the equipotential voltage $V_{eq}$, sourcing an appropriate signal current as is necessary to sustain the voltage drop across the channel region of FeGFET 101e, represented as resistor 151e. The voltage drop ideally appears only across the selected memory cell 109e, and, specifically, the channel region of the corresponding FeGFET 101e. The voltage potentials across other memory cells 109d, 109f connected to selected bit line 126 are ideally held to zero by clamping their respective word lines 112, 120 to equipotential voltage $V_{eq}$. Hence, the signal current supplied by the sense amplifier to bit line 126 is substantially equal to a difference between the equipotential voltage $V_{eq}$ and the voltage on word line 116, divided by the channel resistance of FeGFET 101e. The resultant sign of the current flow through the channel region of the selected FeGFET 101e indicates whether the sensing current is sourced or sunk from the bit line 126.

Preferably, no significant noise current flows through the other FeGFETs 101d, 101f connected to the selected bit line 126, since no driving potential exists across these unselected FeGFETs. The word lines 112, 120 corresponding to these other memory cells 101d, 101f, respectively, are preferably held at the same potential as the bit line 126, for example, the equipotential voltage $V_{eq}$. Noise current flowing through one or more unselected memory cells can contaminate sensing during the read operation, since the total current sourced or sunk by the sense amplifier is primarily the sum of the signal current plus the noise current components. Noise currents arise primarily from mismatches in the memory array or in peripheral circuitry associated therewith. In a worst-case scenario, the total noise current can be greater than the signal current.

Ideally, the sense amplifier forces the equipotential voltage $V_{eq}$ across the selected memory cell (or cells) and forces zero voltage across unselected memory cells. In this instance, the sensed read current would then depend only on the state of the selected memory cell 109e. Unfortunately, however, mismatches, such as, for example, in the thresholds of transistors used for clamping the bit lines, word lines, and sense amplifier to $V_{eq}$, may generate small offset voltage drops across unselected memory cells, thereby reducing the signal-to-noise ratio of the memory array 100. To alleviate this problem, an auto-zero sense amplifier (not shown) can be employed to correct such mismatches, for example, as an offset compensation scheme. Auto-zero sense amplifiers that are suitable for use with the present invention are known by those skilled in the art, and consequently, a detailed discussion of such sense amplifiers will not be presented herein.

Figure 3:
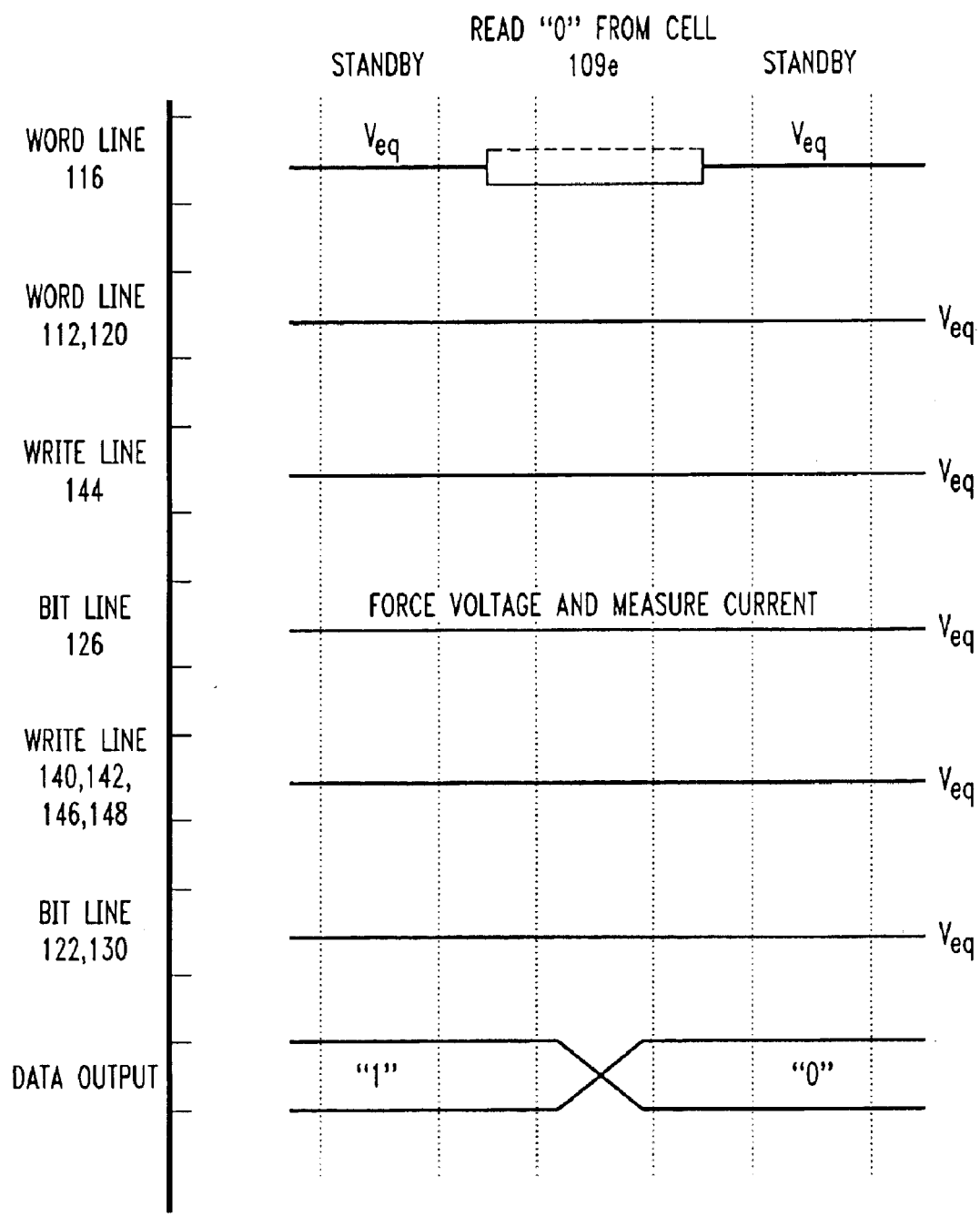
FIG. 3 is a logical timing diagram illustrating exemplary signals for reading a selected memory cell in the memory array shown in FIG. 1, in accordance with the present invention.

FIG. 3 illustrates a logical timing diagram depicting exemplary signals used for reading a selected memory cell 109e, in accordance with the present invention. As apparent from the figure, all write lines 140, 142, 146, 148, including selected write line 144, as well as bit lines 122, 130 and word lines 112, 120 other than those connected to the selected memory cell 109e, are held at the equipotential voltage $V_{eq}$. During the read operation, a voltage substantially equal to the equipotential voltage $V_{eq}$ is preferably forced on bit line 126 associated with selected memory cell 109e and the resulting current necessary to maintain the voltage drop is concurrently measured. At essentially the same time, word line 116 associated with selected memory cell 109e preferably transitions from the equipotential voltage $V_{eq}$ to a voltage slightly less than or greater than $V_{eq}$, but not so far less than or greater than $V_{eq}$ so as to exceed a coercive voltage $V_C$ (defined herein as the voltage necessary to reverse an electric dipole orientation of a given FeGFET) associated with FeGFET 101e in the selected memory cell 109e, thus maintaining the logical state of the cell.

Referring again to FIG. 1, a write operation directed to a selected memory cell 109e will be described. During a write operation of the selected memory cell, an electric field is selectively applied to the ferroelectric gate dielectric layer of the FeGFET device 101e associated with the selected memory cell 109e in order to reverse the electric dipole orientation of the FeGFET, as will be explained in further detail below. A voltage equal to or exceeding the coercive voltage $V_C$, which, as previously stated, is defined as the voltage necessary to reverse the electric dipole orientation of a FeGFET, is used to generate the necessary electric field for writing the selected FeGFET.

When a negative potential is applied across the ferroelectric gate dielectric layer of a given FeGFET which is sufficient to create a field greater than the coercive field of the material forming the ferroelectric gate dielectric layer, the ferroelectric gate dielectric layer becomes polarized in a manner which draws holes (i.e., positive charge carriers) into the channel region of the FeGFET. Since the channel region is preferably formed of an n-type material, the presence of additional holes in the material decreases the conductivity of the channel. The reverse holds true for a channel region formed of p-type material. Due to remanent polarization of the ferroelectric material in the ferroelectric gate dielectric layer, the channel region remains in a low conductivity state, even after the gate potential is removed from the device, or when the gate/source-drain potential goes to zero. Since the low-conductivity state is maintained when the gate field is removed, it is considered to be a non-volatile state.

Alternatively, a positive potential, sufficient to create a field greater than the coercive field, may be applied across the ferroelectric gate dielectric layer of the FeGFET. In this case, the ferroelectric gate dielectric layer becomes polarized in a manner which draws electrons (i.e., negative charge carriers) into the channel region. Again, since the material forming the channel region is preferably an n-type material, the presence of additional electrons in the material increases the conductivity of the channel. As previously stated, due to the remanent polarization of the material in the ferroelectric gate dielectric layer, the channel region remains in a high conductivity state when the gate field is removed, or when the gate/source-drain potential goes to zero.

It is assumed that all memory cells, including the selected memory cell, are initially in the standby mode of operation, as previously stated. To write a given memory cell, voltages are concurrently applied to the selected word line and bit line pair and to the write line corresponding to the selected memory cell, such that a summation of the voltages across the ferroelectric gate dielectric layer of the FeGFET is at least equal to the coercive voltage $V_C$. For example, to write a selected FeGFET 101e to one electric dipole orientation, a voltage of $-V_C/2$ may be applied to word line 116 and bit line 126, while an equal and opposite polarity voltage of $+V_C/2$ may be applied to write line 144, whereby the total voltage across the ferroelectric gate dielectric layer of FeGFET 101e (i.e., $V_T = V_{144} - V_{116}$, where $V_T$ is the total voltage across the ferroelectric gate dielectric layer of FeGFET 101e, $V_{144}$ is the voltage on write line 144, and $V_{116}$ is the voltage on word line 116) will be equal to $V_C$. In order to write the selected FeGFET 101e to the opposite electric dipole orientation, the signs of the two voltages applied to write line 144, word line 116 and bit line 126 may be reversed. In this manner, the field generated by the potential difference between the write line 144 and the word line 116 and bit line 126 pair preferably writes the ferroelectric dipole of the FeGFET 101e to a positive or negative orientation, corresponding to a logic "1" or "0" state, respectively, in selected memory cell 109e. An advantage of memory array 100 is that it enables the voltage on the bit line and word line corresponding to the selected memory cell to be driven to the same potential during a write operation, so that a uniform field is directed across the ferroelectric gate dielectric layer of the FeGFET corresponding to the selected memory cell.

Figure 4:
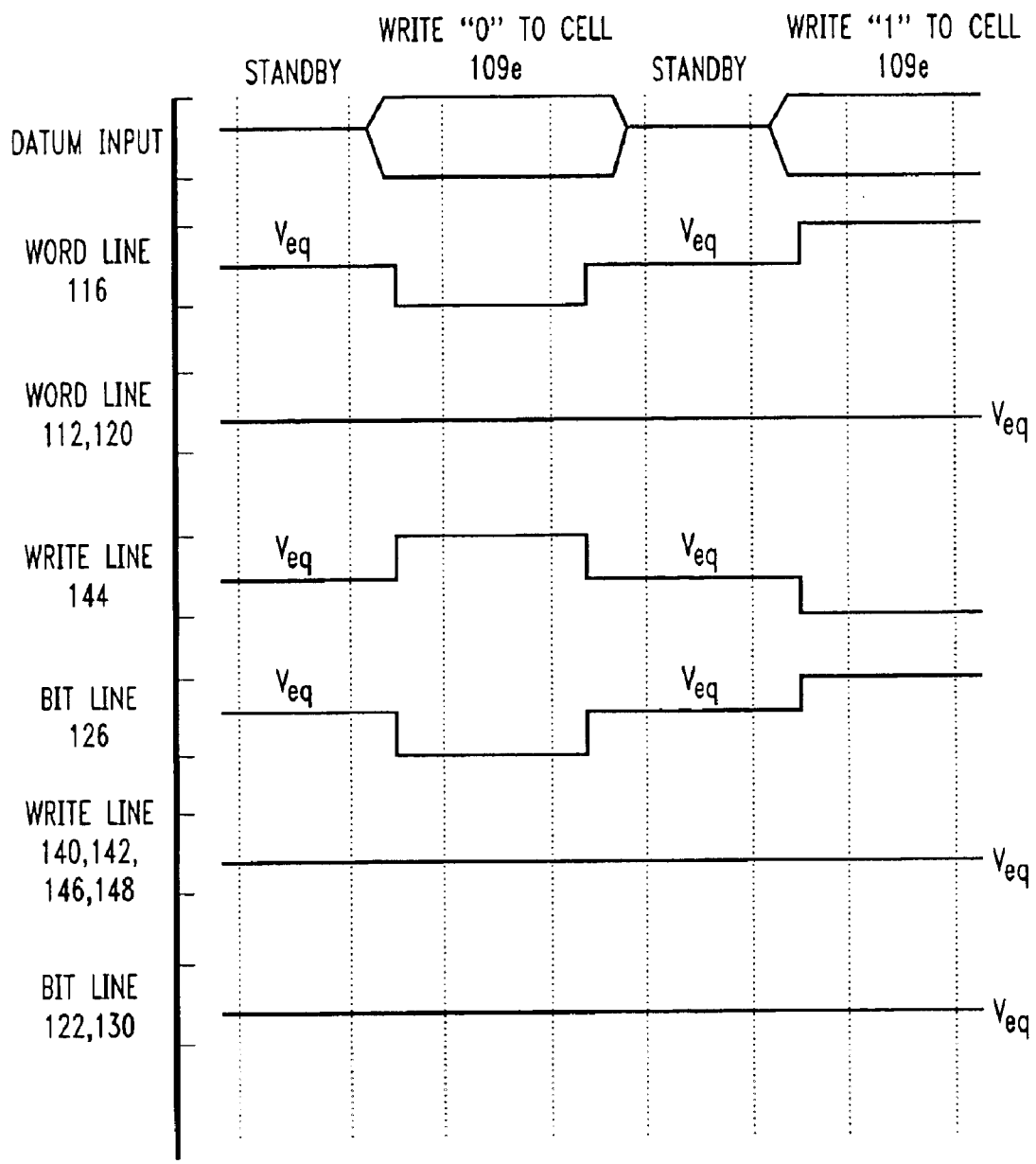
FIG. 4 is a logical timing diagram illustrating exemplary signals for writing a selected memory cell in the memory array shown in FIG. 1, in accordance with the present invention.

FIG. 4 illustrates a logical timing diagram depicting exemplary signals used for writing a selected memory cell 109e, in accordance with the present invention. As apparent from the figure, write lines 140, 142, 146, 148, bit lines 122, 130 and word lines 112, 120 other than those connected to the selected memory cell 109e, are held at the equipotential voltage $V_{eq}$. During the write operation, a voltage substantially equal to or less than $-V_C/2$, which may be ground, is preferably forced on bit line 126 and word line 116 associated with selected memory cell 109e, while a voltage substantially equal to or greater than $V_C/2$, which may be VDD, is preferably applied to write line 144. As previously explained, the sum of the two voltages across the ferroelectric gate dielectric layer of FeGFET 101e will preferably be equal to or exceed the coercive voltage $V_C$ of FeGFET 101e, thereby enabling the FeGFET to be written. FeGFET 109e maybe written to an opposite state by simply reversing the respective polarities of the voltages applied to bit line 126, word line 116 and write line 144 corresponding to FeGFET 109e.

Figure 5:
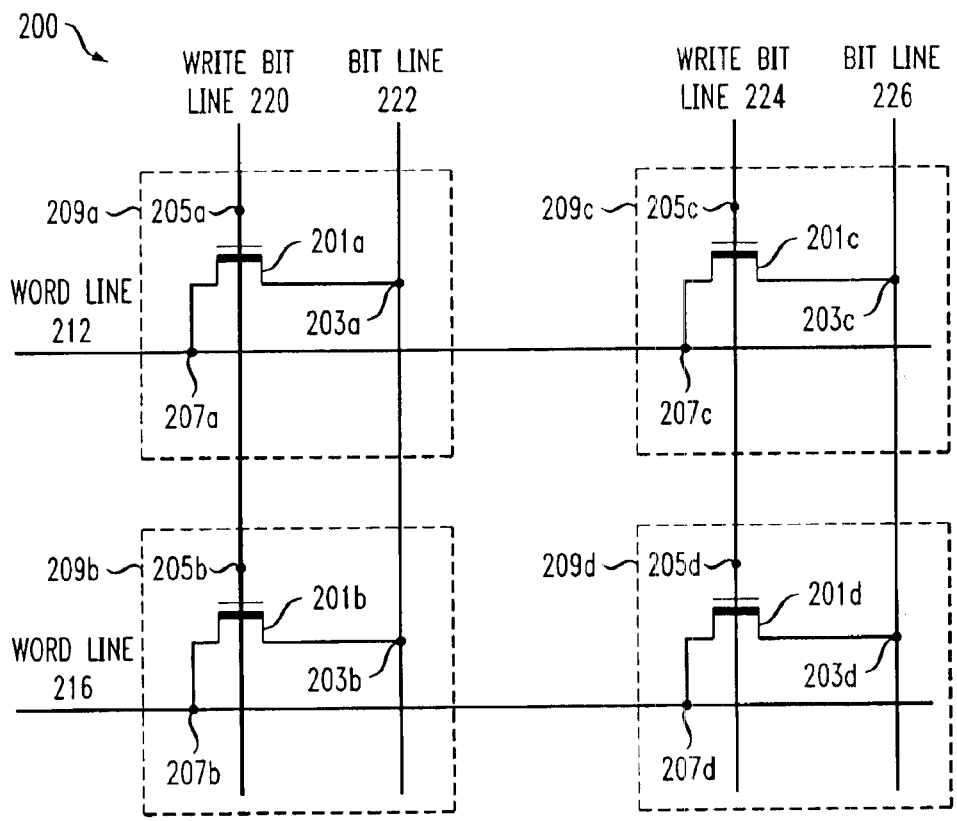
FIG. 5 is an electrical schematic diagram depicting at least a portion of an illustrative non-volatile memory array, formed in accordance with another aspect of the invention.

FIG. 5 illustrates at least a portion of an alternative non-volatile memory array 200, formed in accordance with another aspect of the present invention. The memory array 200 preferably comprises a plurality of memory cells 209a, 209b, 209c and 209d (referred to herein collectively as 209), a plurality of write bit lines 220 and 224, a plurality of bit lines 222 and 226, and a plurality of word lines 212 and 216 operatively coupled to the memory cells 209 for selectively reading and writing one or more memory cells in the array. Like the illustrative memory array 100 described above, memory array 200 is configured so as to eliminate the need for a pass gate or FET in each of the memory cells, thereby advantageously providing a more dense memory array compared to conventional memory architectures. Moreover, the arrangement of the write lines in memory array 200 may provide advantages over the memory array 100, particularly in ease of integrated circuit fabrication layout, as will be understood by those skilled in the art.

Illustrative memory array 200 is similar to memory array 100 (shown in FIG. 1) in that the bit lines 222, 226 are preferably arranged parallel to one another and orthogonal to the word lines 212, 216. For example, bit lines 222, 226 may be arranged in a column (i.e., vertical) dimension and word lines 212, 216 may be arranged in a row (i.e., horizontal) dimension, as depicted in FIG. 5. However, compared to the diagonal write lines in memory array 100, the write bit lines 220, 224 in memory array 200 are preferably arranged parallel to the bit lines, namely, in a vertical dimension. It is to be understood that alternative arrangements are similarly contemplated by the present invention. A complete memory circuit may be formed by connecting the write bit lines 220, 224, bit lines 222, 226, and word lines 212, 216 of memory array 200 to peripheral circuitry (not shown), including, for example, word drivers, bit drivers/multiplexors, write circuits (e.g., decoders), read circuits (e.g., sense amplifiers), etc.

As in memory array 100 previously described, the memory cells 209 in illustrative memory array 200 are preferably coupled at the intersections of corresponding bit lines and word lines, as in a crosspoint array configuration, although alternative connection arrangements are contemplated. Each of the memory cells 209a, 209b, 209c, 209d comprises a corresponding FeGFET 201a, 201b, 201c, 201d, respectively, for storing the logical state of the memory cell. In the illustrative memory array 200, FeGFET 201a in memory cell 209a is configured so that its gate terminal is coupled to write bit line 220 at node 205a, its first drain/source terminal is coupled to word line 212 at node 207a, and its second drain/source terminal is coupled to bit line 222 at node 203a. Likewise, in memory cell 209b, the gate terminal of FeGFET 201b is coupled to write bit line 220 at node 205b, the first drain/source terminal is coupled to word line 216 at node 207b, and the second drain/source terminal is coupled to bit line 222 at node 203b. The gate terminal of FeGFET 201c in memory cell 209c is coupled to write bit line 224 at node 205c, the first drain/source terminal is coupled to word line 212 at node 207c, and the second drain/source terminal is coupled to bit line 226 at node 203c. The gate terminal of FeGFET 201d in memory cell 209d is coupled to write bit line 224 at node 205d, the first drain/source terminal is coupled to word line 216 at node 207d, and the second drain/source terminal is coupled to bit line 226 at node 203d.

For the illustrative memory array 200, the memory cells 209 are utilized in at least a standby mode, a read mode, or a write mode. The memory cells preferably remain in the standby mode until a read or write operation is requested, and subsequently return to the standby mode once the read or write operation has ended. In a standby mode of operation, the state of the memory cell, which is stored within the FeGFET device, is protected (i.e., maintained). In a manner similar to that described above in conjunction with memory array 100 depicted in FIG. 1, by electrically coupling the gate, drain and source terminals of the FeGFET devices to a common equipotential voltage $V_{eq}$, a uniformity of the electric dipole orientation of the ferroelectric gate dielectric layer in each FeGFET is maintained. The absence of electric fields prevents field-induced reversal of any domains (i.e., electric dipoles) within the FeGFET devices, thus preserving the logical states of all memory cells 209 in the memory array 200.

The read operation in the illustrative memory array 200 is preferably performed in the same manner as that previously explained in connection with memory array 100 shown in FIGS. 1 and 2. Specifically, the conductance of the channel region in a selected FeGFET 201a, in either of two stable states, is determined. As long as this determination is made with a potential less than the coercive field associated with the ferroelectric gate dielectric layer, the read will be non-destructive (i.e., the state of the channel will be maintained), as previously stated. Therefore, to accomplish the read operation directed to selected memory cell 209a without disturbing the existing states of the memory cells 209, write bit lines 220, 224, bit line 226, and word line 216 are preferably held at the equipotential voltage $V_{eq}$. The equipotential voltage $V_{eq}$ may be set halfway between the positive (e.g., $V_{DD}$) and negative (e.g., ground) voltage supply rails (e.g., $V_{DD}/2$). Word line 212 is preferably used to partially select the selected memory cell 209a for the read operation by applying a voltage that is slightly less than or greater than the equipotential voltage $V_{eq}$. Concurrently, an equipotential voltage $V_{eq}$ is forced on bit line 222 and the resulting current is measured, or vice versa, to determine the conductance of the channel region of the selected FeGFET 201a. With the terminals of the respective FeGFETs held at substantially the same potential, no electric fields will be present across the ferroelectric gate dielectric layers in the FeGFETs.

Figure 6:
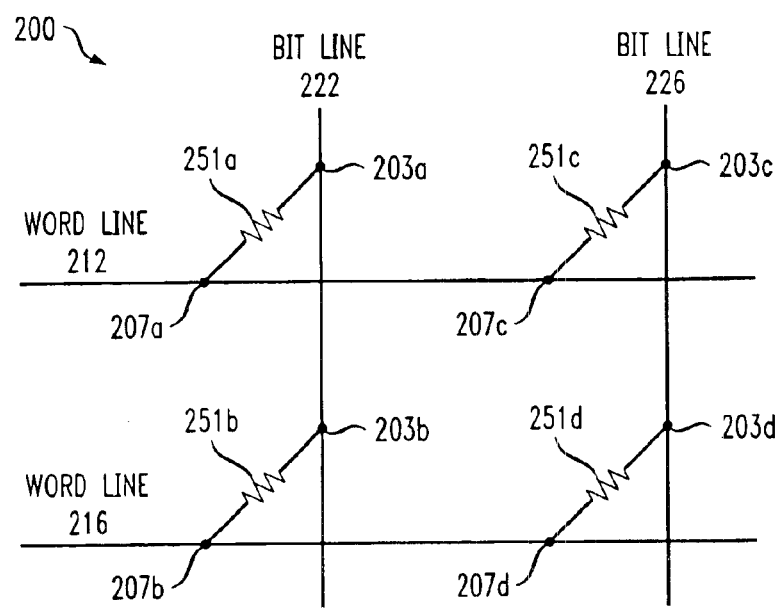
FIG. 6 is an electrical schematic diagram illustrating a simplified circuit of the memory array shown in FIG. 5.

FIG. 6 depicts a schematic diagram of memory array 200 which has been simplified to describe the read operation. As shown in the figure, the channel regions of the FeGFET devices 201a, 201b, 201c, 201d may be modeled as resistors 251a, 251b, 251c, 251d, respectively, (referred to herein collectively as 251) coupled between corresponding bit lines and word lines in the array. For example, the channel region associated with FeGFET 201a is represented as resistor 251a coupled across bit line 222 at node 203a and word line 212 at node 207a. As previously explained, the resistance value of each of the resistors 251 changes in accordance with the logical state of the FeGFET device associated therewith, which represents one of two possible dipole orientations of the FeGFET. Write bit lines 220, 224 are preferably held at the equipotential voltage $V_{eq}$ during a read operation and are therefore not shown in FIG. 6. The resistance (conductance) of the channel region of a FeGFET in a selected memory cell is preferably determined by forcing a voltage and concurrently measuring a signal current (or vice versa), as is known in the art. The measured resistance value is representative of the logical state of the memory cell corresponding thereto, as previously stated.

Figure 7:
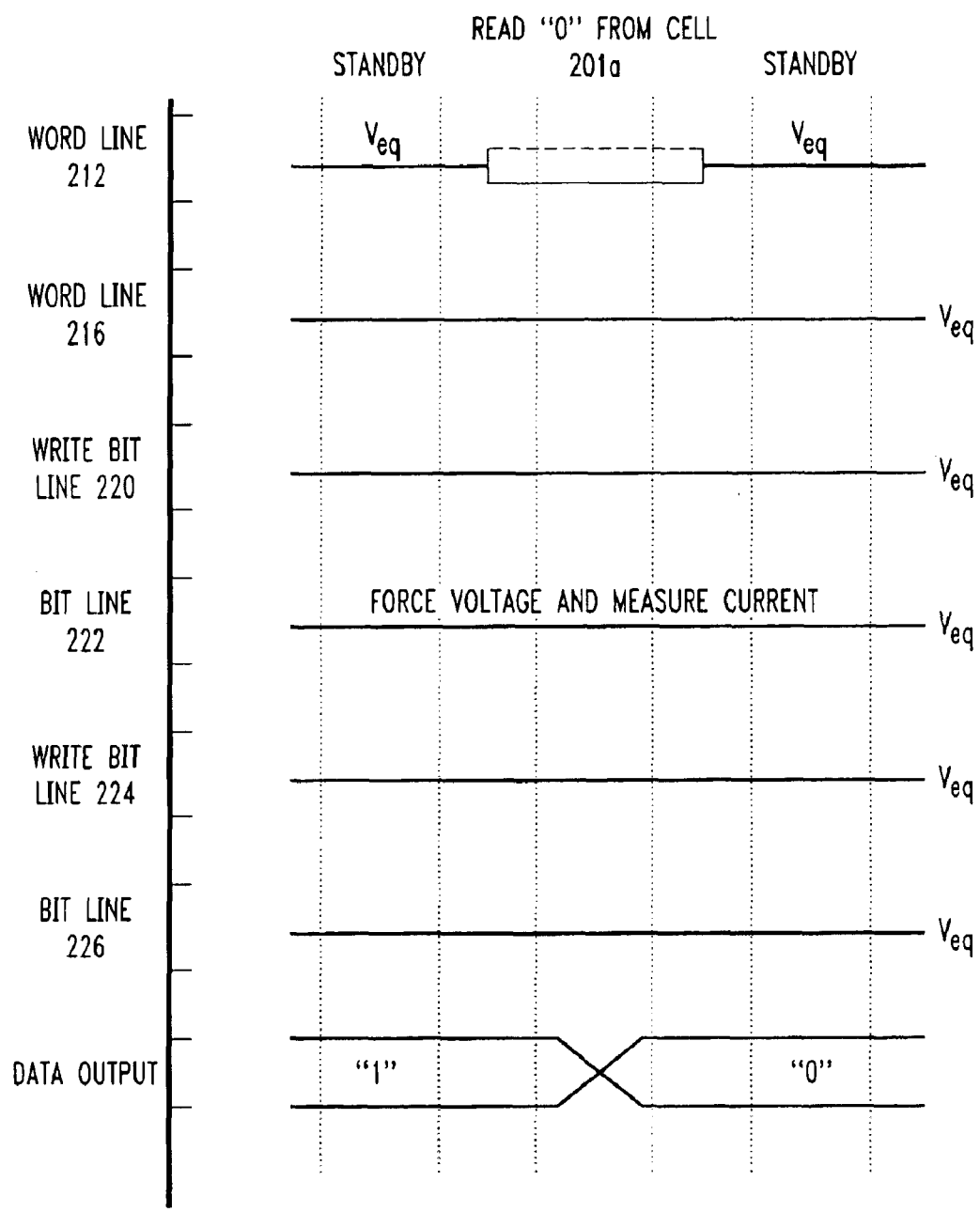
FIG. 7 is a logical timing diagram illustrating exemplary signals for reading a selected memory cell in the memory array shown in FIG. 5, in accordance with the present invention.

FIG. 7 illustrates a timing diagram depicting exemplary signals used for reading the selected memory cell 209a, in accordance with the present invention. As apparent from the figure, all write bit lines 220, 224, as well as bit line 226 and word line 216 other than those connected to the selected memory cell 209a, are held at the equipotential voltage $V_{eq}$. During the read operation, a voltage substantially equal to the equipotential voltage $V_{eq}$ is preferably forced on bit line 222 and the resulting current necessary to maintain the voltage drop is concurrently measured. At essentially the same time, word line 212 preferably transitions from the equipotential voltage $V_{eq}$ to a voltage less than or greater than $V_{eq}$, but not too far less than or greater than $V_{eq}$ so as to exceed the coercive voltage associated with FeGFET 201a in the selected memory cell 209a, thus maintaining the logical state of the cell.

By way of example only, a write operation directed to a selected memory cell 209a in the illustrative memory array 200 will now be described in conjunction with FIG. 5. In the following discussion, it will be assumed that all memory cells, including selected memory cell 209a, are initially in a standby mode of operation, as previously explained. The write operation for memory array 200 differs somewhat from the write operation described in conjunction with memory array 100 in FIG. 1. The reason for this distinction may be attributed to the connection arrangement of the write bit lines in the array 200. Recall, that in the memory array 100 of FIG. 1, write lines were coupled to corresponding memory cells along a diagonal dimension, such that no two memory cells along the same write line shared the same word line or bit line. The memory array 200 of FIG. 5 is configured such that memory cells coupled to the same write bit line also share the same bit line. The memory array 200 of FIG. 5 provides a compact memory cell and simplified decoding circuits as compared with the memory array 100 of FIG. 1. As will be discussed below, an advantage of memory array 100 over memory array 200 relates to write operation, and more specifically to the storage of the logical state in the ferroelectric gate dielectric layer. Thus, each of the memory architectures have certain tradeoffs associated therewith.

With continued reference to FIG. 5, during the write operation, the bit lines 222, 226 are preferably held at the equipotential voltage $V_{eq}$, which, as previously stated, may be halfway between the positive and negative voltage supply rails (e.g., $V_{DD}/2$). The word lines (e.g., 216) and write bit lines (e.g., 224) corresponding to unselected memory cells (e.g., 209b, 209c, 209d) in the memory array 200 are also preferably held at the equipotential voltage $V_{eq}$. In order to write the selected memory cell 209a to a desired logical state (e.g., a "0" or "1"), voltages applied to word line 212 and write bit line 220 coupled to the FeGFET 201a in selected memory cell 209a are effectively summed across the first drain/source terminal, at node 207a, and the gate terminal, at node 205a, of the FeGFET 201a, such that a summation of the two voltages is at least equal to the coercive voltage $V_C$ of the ferroelectric gate dielectric layer in FeGFET 201a.

Preferably, to write a logic "0" to a selected memory cell 209a, a voltage of $-V_C/2$ may be applied to word line 212 while a voltage of $V_C/2$ may be applied to write bit line 220, so that the total voltage across the ferroelectric gate dielectric layer of FeGFET 201a will be equal to $V_C$. In order to write the selected FeGFET 201a to the opposite electric dipole orientation, the signs of the two voltages applied to write bit line 220 and word line 212 are reversed. In this manner, the field generated by the potential difference between the write bit line 220 and the word line 212 preferably writes the ferroelectric dipole of FeGFET 201a to a positive or negative orientation, corresponding to a logic "1" or "0," respectively, in selected memory cell 209a.

Unfortunately, the portion of the ferroelectric gate dielectric layer in the vicinity of the second drain/source terminal, connected to node 203a, only sees half the coercive voltage, either $V_C/2$ or $-V_C/2$, instead of the full coercive voltage, $V_C$ or $-V_C$, because bit line 222 is preferably held close to the equipotential voltage $V_{eq}$. If the voltage on bit line 222 was set to that of word line 212, as was the case for memory array 100 shown in FIG. 1, unselected memory cell 209b would inadvertently be written because the full coercive voltage, $V_C$ or $-V_C$, would be applied to the portion of the ferroelectric gate dielectric layer in the vicinity of the second drain/source terminal, connected to node 203b. In memory array 200, there is no means to apply a uniform field across the ferroelectric gate dielectric layer of the selected memory cell without inadvertently writing unselected memory cells as well.

Figure 8:
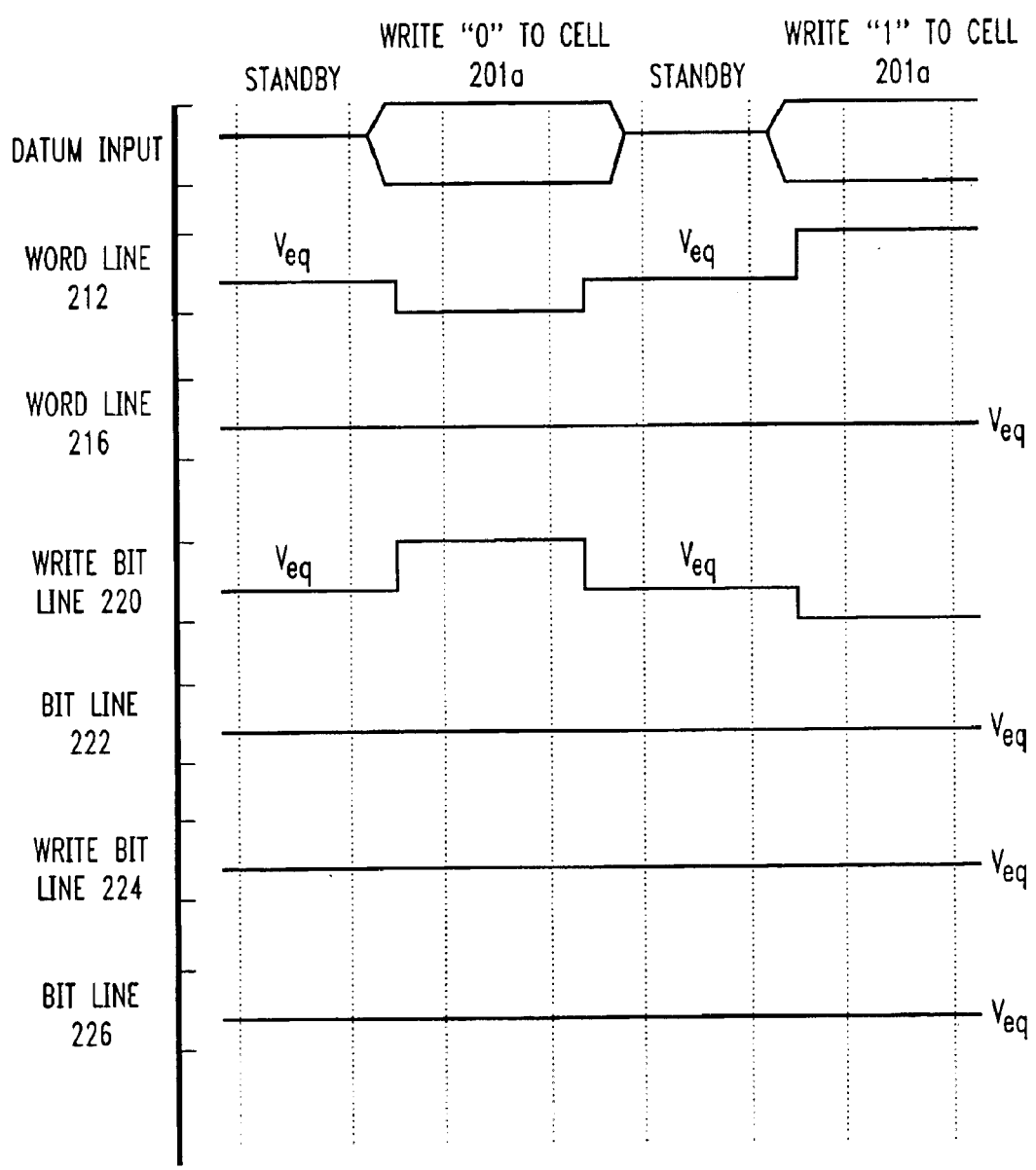
FIG. 8 is a logical timing diagram illustrating exemplary signals for writing a selected memory cell in the memory array shown in FIG. 5, in accordance with the present invention.

FIG. 8 illustrates a timing diagram depicting exemplary signals used for writing the logical state of a selected FeGFET 201a in memory cell 209a, in accordance with the present invention. As shown in the figure, write bit line 224, word line 216, and bit line 226 corresponding to unselected memory cells are held at the equipotential voltage $V_{eq}$. Bit line 222 corresponding to selected memory cell 209a is also held at the equipotential voltage $V_{eq}$, as previously explained. During a write "0" operation of memory cell 209a, word line 212 transitions from the equipotential voltage $V_{eq}$, which may be $V_{DD}/2$, to a voltage of $-V_C/2$, which may be zero volts. Concurrently, write bit line 220 transitions from a voltage of $V_{DD}/2$ to $V_C/2$, which may be VDD, thereby applying a voltage at least equal to the coercive voltage $V_C$ across the ferroelectric gate dielectric layer of FeGFET 201a. Likewise, during a write "1" operation, the polarities of the voltage on word line 212 and write bit line 220 corresponding to selected memory cell 209a are reversed.

In accordance with another embodiment of the present invention (not shown), separate instantiations of memory arrays 100, 200 may be stacked, e.g., one on top of another. By stacking two or more memory cells on top of one another in a vertical dimension, an improvement in storage density may be achieved, thus minimizing die cost. Reading and writing operations for this stacked memory architecture may be performed in a manner similar to that previously described for the respective memory array configurations.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A non-volatile memory array, comprising:

a plurality of memory cells, each of at least a portion of the memory cells comprising a three-terminal non-volatile storage element for storing a logical state of the memory cell, the non-volatile storage element having a gate terminal, a first drain/source terminal and a second drain/source terminal, the non-volatile storage element comprising a ferroelectric gate field-effect transistor (FeGFET);

a plurality of write lines operatively coupled to the gate terminals of corresponding non-volatile storage elements in the memory cells for selectively writing one or more memory cells in the memory array; and a plurality of bit lines and word lines operatively coupled to the memory cells for selectively reading and writing one or more memory cells in the memory array;

wherein the write lines are arranged such that no two memory cells coupled to a same write line share a same word line or a same bit line, and wherein the memory array is configured so as to eliminate a need for a pass gate being operatively coupled to a corresponding non-volatile storage element in the at least one memory cell;

wherein each of at least a portion of the memory cells is selectively operable in at least a first mode, wherein a logical state of the at least one memory cell is read, and a second mode, wherein the at least one memory cell is written to a predetermined logical state, the second mode comprising: (i) applying a first voltage to the first drain/source terminal of the FeGFET and applying a second voltage to the second drain/source terminal of the FeGFET, the first voltage and the second voltage being substantially equal to one another; and (ii) applying a third voltage to the gate terminal of the FeGFET, the third voltage having a magnitude and polarity which, when summed with the first voltage or the second voltage, results in a voltage potential at least equal to a coercive voltage $V_C$ of a ferroelectric sate dielectric layer in the FeGFET.

2. The memory array of claim 1, wherein:
the word lines are arranged substantially orthogonal to the bit lines; and
the write lines are arranged substantially diagonal with respect to the word lines and bit lines.

3. The memory array of claim 1, wherein each of at least a portion of the memory cells is operatively coupled at an intersection of a bit line and a corresponding word line.

4. The memory array of claim 1, wherein the first drain/source terminal of the non-volatile storage element is coupled to a corresponding word line and the second drain/source terminal of the non-volatile storage element is coupled to a corresponding bit line.

5. The memory array of claim 1, wherein the first mode of operation comprises determining a conductance of a region between the first and second drain/source terminals of the non-volatile storage element, the conductance being representative of the logical state of the at least one memory cell.

6. The memory array of claim 5, wherein during the first mode of operation, the conductance of the region between the first and second drain/source terminals in the non-volatile storage element is determined by performing at least one of:
applying a predetermined voltage potential across the first and second drain/source terminals of the non-volatile storage element and substantially concurrently measuring a current flowing through the region between the first and second drain/source terminals of the non-volatile storage element; and
applying a predetermined current through the region between the first and second drain/source terminals of the non-volatile storage element and substantially concurrently measuring a voltage across the first and second drain/source terminals of the non-volatile storage element.

7. The memory array of claim 1, wherein during the second mode of operation, the logical state of the at least one memory cell is written by applying a voltage potential between the gate terminal of the FeGFET and at least one of the first and second drain/source terminals of the FeGFET, such that an electric field is generated in a ferroelectric gate dielectric layer in the FeGFET which is at least equal to a coercive field associated with the ferroelectric gate dielectric layer, whereby the logical state of the memory cell is stored in the FeGFET, the logical state being determined at least in part by a direction of the electric field.

8. The memory array of claim 1, wherein the first voltage has a potential substantially equal to one-half of the coercive voltage ($V_C/2$), and the third voltage has a potential substantially equal to one-half the coercive voltage and a polarity which is opposite a polarity of the first voltage ($-V_C/2$).

9. The memory array of claim 1, wherein each of at least a portion of the memory cells is further selectively operable in at least a third mode, wherein voltage potentials at the gate terminal, the first drain/source terminal and the second of the non-volatile storage element are substantially equal to one another, thereby maintaining the logical state of the at least one memory cell.

10. The memory array of claim 1, wherein at least two memory cells are stacked on top of one another in a vertical dimension.

11. A method of forming a non-volatile memory array, comprising the steps of:

providing a plurality of memory cells, each of at least a portion of the memory cells comprising a three-terminal non-volatile storage element for storing a logical state of the memory cell, the non-volatile storage element having a gate terminal, a first drain/source terminal and a second drain/source terminal, the non-volatile storage element comprising a ferroelectric gate field-effect transistor (FeGFET);

coupling the memory cells to a plurality of write lines, bit lines and word lines for selectively reading and writing the logical state of one or more memory cells in the memory array, the memory cells being operatively coupled to the write lines, bit lines and word lines so as to eliminate a need for a pass gate being coupled to a corresponding non-volatile storage element in the at least one memory cell, the write lines being arranged such that no two memory cells coupled to a same write line share a same word line or a same bit line;

during a first mode of operation, selectively reading a logical state of at least one memory cell; and during a second mode of operation, selectively writing a logical state of at least one memory cell;

wherein the step of writing the logical state of the at least one memory cell comprises;

applying a first voltage to the first drain/source terminal of the FeGFET and applying a second voltage to the second drain/source terminal of the FeGFET, the first voltage and the second voltage being substantially equal to one another; and applying a third voltage to the gate terminal of the FeGFET, the third voltage having a magnitude and polarity which, when summed with the first voltage or the second voltage, results in a voltage potential across a ferroelectric gate dielectric layer in the FeGFET at least equal to a coercive voltage $V_C$ of the ferroelectric gate dielectric layer.

12. The method of claim 11, wherein the step of coupling the memory cells to the plurality of write lines, bit lines and word lines comprises:
connecting the first drain/source terminal of each non-volatile storage element to a corresponding word line; and
connecting the second drain/source terminal of each non-volatile storage element to a corresponding bit line.

13. The method of claim 11, further comprising the steps of:
arranging at least a portion of the plurality of word lines to be substantially orthogonal to at least a portion of the plurality of bit lines; and
arranging at least a portion of the plurality of write lines to be substantially diagonal with respect to the word and bit lines.

14. The method of claim 11, wherein the step of reading the logical state of the at least one memory cell comprises determining a conductance of a channel region between the first and second drain/source terminals of the non-volatile storage element, the conductance being representative of the logical state of the at least one memory cell.

15. The method of claim 14, wherein the step of determining the conductance of the channel region comprises at least one of:
applying a predetermined voltage potential across the first and second drain/source terminals of the non-volatile storage element and substantially concurrently measuring a current flowing through the channel region between the first and second drain/source terminals of the non-volatile storage element; and applying a predetermined current through the channel region between the first and second drain/source terminals of the non-volatile storage element and substantially concurrently measuring a voltage across the first and second drain/source terminals of the non-volatile storage element.

16. The method of claim 11, wherein the step of writing the logical state of the at least one memory cell comprises generating an electric field in a ferroelectric gate dielectric layer in the FeGFET which is at least equal to a coercive field associated with the ferroelectric gate dielectric layer, whereby the logical state of the memory cell is stored in the FeGFET, the logical state being determined at least in part by a direction of the electric field.

17. The method of claim 11, wherein the first voltage has a potential substantially equal to one-half of the coercive voltage ($V_C/2$), and the third voltage has a potential substantially equal to one-half the coercive voltage and a polarity which is opposite a polarity of the first voltage ($-V_C/2$).

18. The method of claim 11, further comprising the step of stacking two or more memory cells on top of one another in a vertical dimension.

* * * * *

UNITED STATES PATENT AND TRADEMARK OFFICE
CERTIFICATE OF CORRECTION

PATENT NO. : 6,894,916 B2
DATED : May 17, 2005
INVENTOR(S) : W.R. Reohr et al.

It is certified that error appears in the above-identified patent and that said Letters Patent is hereby corrected as shown below:

Column 13,
Line 2, delete "sate" and insert -- gate --.

Signed and Sealed this

Twelfth Day of July, 2005

JON W. DUDAS
*Director of the United States Patent and Trademark Office*